US005403621A

United States Patent [19]

Jackson et al.

[11] Patent Number: 5,403,621

[45] Date of Patent: Apr. 4, 1995

[54] COATING PROCESS USING DENSE PHASE GAS

[75] Inventors: David P. Jackson, Saugus; Orval F. Buck, Santa Monica, both of Calif.

[73] Assignee: Hughes Aircraft Company, Los Angeles, Calif.

[21] Appl. No.: 130,671

[22] Filed: Oct. 1, 1993

Related U.S. Application Data

[63] Continuation of Ser. No. 805,753, Dec. 12, 1991, abandoned.

[51] Int. Cl.[6] ........................ C23C 16/00; B05D 3/06; B05D 3/10

[52] U.S. Cl. ................................ 427/255.1; 427/337; 427/487; 427/532

[58] Field of Search .................. 427/248.1, 255.1, 337, 427/421, 487, 532

[56] References Cited

U.S. PATENT DOCUMENTS

| | | | |
|---|---|---|---|
| 4,582,731 | 4/1986 | Smith | 427/421 |
| 4,737,384 | 4/1988 | Murthy et al. | |
| 4,844,947 | 7/1989 | Kasner et al. | 427/53.1 |
| 4,923,720 | 5/1990 | Lee et al. | 427/422 |
| 4,970,093 | 11/1990 | Sievers et al. | 427/38 |
| 5,013,366 | 1/1991 | Jackson et al. | 134/1 |
| 5,068,040 | 11/1991 | Jackson | 210/748 |

FOREIGN PATENT DOCUMENTS

| | | | |
|---|---|---|---|
| 0453107 | 10/1991 | European Pat. Off. | C23C 16/00 |
| 2853066 | 6/1980 | Germany | B05D 1/22 |
| 4-222622 | 8/1992 | Japan | B05D 1/18 |

OTHER PUBLICATIONS

Webster's II New Riverside Dictionary, Riverside Publishing Company; 1984 pp. 353 and 390.

*Primary Examiner*—Michael Lusignan
*Assistant Examiner*—Bret Chen
*Attorney, Agent, or Firm*—M. E. Lachman; M. W. Sales; W. K. Denson-Low

[57] ABSTRACT

A process for coating a substrate with a chosen material comprising placing the substrate in a coating chamber and contacting the substrate with a mixture of the selected coating material in a chosen dense phase gas at a selected temperature and a pressure equal to or above the critical pressure of the dense phase gas for a period of time which is sufficient to allow complete penetration of the mixture into all surfaces of the substrate. Then, the phase of the dense phase gas is shifted to produce dissolution of the chosen material from the dense phase gas and to thereby form the coating of the chosen material on the substrate.

11 Claims, 2 Drawing Sheets

COATING PROCESS USING DENSE PHASE GAS

This is a continuation of application Ser. No. 07/805,753, filed Dec. 12, 1991, now abandoned.

BACKGROUND OF THE INVENTION

1. Field of the Invention

The present invention relates to a method for coating a substrate with a selected material. More particularly, the present invention relates to a method for forming such coatings by using phase shifting of a dense phase gas.

2. Description of Related Art

In the manufacture of various articles or structures, it is often desirable to provide a coating on the finished structure in order to provide improved properties or performance. For example, a coating may be applied to a structure to provide a protective outer layer or to impart color to the structure. Known methods for forming such coatings include vapor deposition processes in which vapor phase materials are reacted in the presence of the substrate to form a solid material which deposits on the substrate. In another known process, a solution of the coating material in a solvent is applied to the surface of the substrate and then the solvent is evaporated, to leave the desired coating on the substrate. In some cases, the coating material is impregnated into the substrate, as in a static pressure impregnation process, in which pressure is applied directly to the coating material to force or propel it into the substrate. The pressure vehicle, which may be gas, hydraulic, or piston, contacts the coating material but does not function as a carrier or solvent for the material. While these processes have been widely used, each has limited material applications and capabilities. For example, vapor deposition methods are often used to deposit metallic coatings on external material surfaces. Solvent evaporation processes require the use of solvents which may have undesirable environmental impact. Static pressure impregnation processes put gross amounts of additive materials into or on to a substrate.

Consequently, there is a present need to provide a coating process which has a wider range of applications and which does not require the use of undesirable solvents which may damage the environment.

SUMMARY OF THE INVENTION

In accordance with the present invention, a coating process is provided which is capable of depositing a wide variety of materials on and into substrates of varying complexity in a single continuous process and without the use of undesirable solvents. This process possesses the advantages of the above prior processes while overcoming their above-mentioned significant disadvantages.

The present invention is based on a process wherein the substrate to be coated is placed in a coating chamber and is contacted with a mixture of the selected coating material in a chosen dense phase gas in which the selected coating material is soluble, at a pressure equal to or above the critical pressure of the dense phase gas for a period of time which is sufficient to allow complete penetration of the mixture into all surfaces of the substrate. Then, the phase of the dense phase gas is shifted to produce dissolution of the chosen material from the dense phase gas and to thereby form the coating of the chosen material on the substrate.

The above-discussed and many other features and attendant advantages of the present invention will become better understood by reference to the following detailed description when considered in conjunction with the accompanying drawings.

DESCRIPTION OF THE PREFERRED EMBODIMENTS

Figure 1:
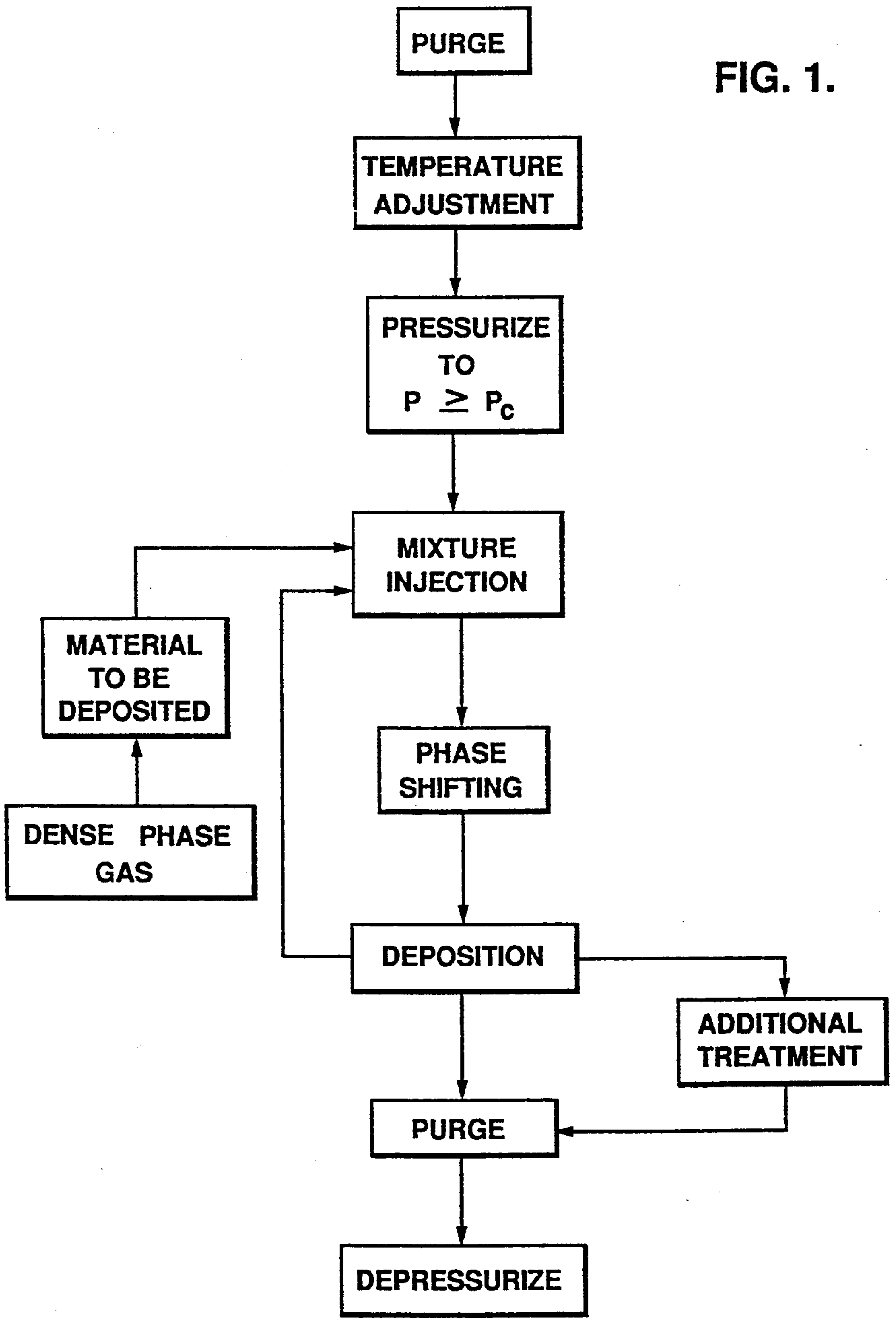
FIG. 1 is a flowchart setting forth the steps in an exemplary process in accordance with the present invention.

In accordance with the present invention, a dense phase gas is used as the carrier solvent for the material to be deposited on the substrate. The term "dense phase gas" is used herein to mean a gas which is compressed to either supercritical or subcritical conditions to achieve liquid-like densities. Supercritical gases have been previously used as solvents in a wide variety of applications to remove undesired materials, such as: extracting oil from soybeans; removing caffeine from coffee; and removing adsorbed material from an adsorbent, such as activated carbon, to regenerate the adsorbent. However, the present invention takes advantage of the superior solvent properties of dense phase gases in order to deposit a desired material on a substrate. The dense phase gases which are used as carrier solvents in the present process have chemical and physical properties which make them ideal penetration media. Dense fluid properties such as pressure-dependent and temperature-dependent solute carrying capacity, low surface tension, low viscosity, variable fluid density, and wide-ranging solvent power provide for rapid penetration and deposition of the desired material on or into the substrate.

The dense phase gases which may be used in accordance with the present invention include any of the known gases which may be converted to supercritical fluids or liquefied at temperatures and pressures which will not degrade the physical or chemical properties of the substrate being treated. These gases typically include, but are not limited to: (1) hydrocarbons, such as methane, ethane, propane, butane, pentane, hexane, ethylene, and propylene; (2) halogenated hydrocarbons such as tetrafluoromethane, chlorodifluoromethane, sulfur hexafluoride, and perfluoropropane; (3) inorganics such as carbon dioxide, ammonia, helium, krypton, argon, and nitrous oxide; and (4) mixtures thereof. The term "dense phase gas" as used herein is intended to include mixtures of such dense phase gases. The dense phase gas used in the present process is selected to have a solubility chemistry which is similar to that of the material which it must dissolve. For example, if hydrogen bonding makes a significant contribution to the internal cohesive energy content, or stability, of the material to be deposited, the chosen dense phase gas must possess at least moderate hydrogen bonding ability in order for solvation to occur. In some cases, a mixture of two or more dense phase gases may be formulated in order to have the desired solvent properties. The selected dense phase gas must also be compatible with the substrate being cleaned, and preferably has a low cost and high health and safety ratings.

Carbon dioxide is a preferred dense phase gas for use in practicing the present invention since it is inexpensive and non-toxic. The critical temperature of carbon dioxide is 305° Kelvin (32° C.) and the critical pressure is 72.9 atmospheres. At pressures above the critical point, the phase of the carbon dioxide can be shifted between the liquid phase and supercritical fluid phase by varying the temperature above or below the critical temperature of 305 Kelvin (K).

The chosen material which is deposited on the substrate in accordance with the present invention may be any material which can be dissolved in the chosen dense phase gas and subsequently precipitated out of solution by changing the phase of the dense phase gas, to form the desired coating. The chosen material may be either a gas or a liquid. The term "coating" is used herein to mean a layer of material formed on the surface of the substrate, whether the surface is external or is in the interstices of the substrate structure. Such coating materials may be inorganic or organic and include, for example, colorants, dyes, fire retardants, metals, organo-metallics, dielectric fluids, humectants, preservatives, odorants, deodorants, plasticizers, fillers, biocides, oxidants, reductants, or other reactants. A mixture of two or more materials may be deposited in a single step in accordance with the present invention.

The dense phase gas which is suitable for use with a chosen material to be deposited is selected based on the solvent power of the dense phase gas. One way of describing solvent power is through the use of the Hildebrand solubility parameters (δ) concept, as described by A. F. Barton, in the "*HANDBOOK OF SOLUBILITY PARAMETERS AND OTHER COHESION PARAMETERS*", Boca Raton, CRC Press, Inc., p. 8 et seq., 1983, the contents of which are incorporated herein by reference. The vaporization energies ($\Delta H_v^g$) for liquids are reflective of the combined result of interactions such as hydrogen bonding and polar/nonpolar effects. Thus, similar compounds tend to have similar vaporization energies. Vaporization energies are the basis for a mathematical expression quantifying cohesive energy densities for compounds in a condensed state, the square root of which Hildebrand called solubility parameters according to the equation:

$$\delta_{liquid} = \sqrt{\frac{\Delta H_v^g - RT}{V}}$$

where

H=Heat of vaporization
R=Gas constant
T=Temperature
V=Molar volume

The units for the solubility parameter are $cal^{1/2}cm^{3/2}$ or $MPa^{1/2}$ cohesive pressure units, where 1 $cal^{1/2}cm^{3/2}$=2.05 $MPa^{1/2}$. The principle behind solubility parameter technology is that compounds having similar solubility parameters are chemically alike and therefore should be miscible in one another (that is, the principle that "like dissolves like"). Generally, this approach is sufficiently accurate for matching a desired material to be deposited with a suitable dense phase gas carrier solvent. If greater accuracy is required, more precise calculative methods are known and described, for example, by A. F. Barton, previously referenced, at page 224 et seq.

In accordance with the present invention, the material to be deposited is first dissolved in the chosen dense phase gas, and then the dense phase gas is "phase shifted" from the supercritical state to the liquid state or vice versa to cause the desired material to precipitate out and deposit on the substrate. When the dense phase gas is shifted from one phase to the other, a corresponding change in the cohesive energy density or solubility parameter of the dense phase gas occurs. This solubility change affects the ability of the dense phase gas to dissolve the material to be deposited. In accordance with the present process, this phase shifting is selected so that the material to be deposited becomes less soluble in the dense phase gas and precipitates out onto the substrate. The phase shifting is preferably accomplished by varying the pressure of the dense phase gas, using a pump and valving control sequence, while maintaining the temperature at a relatively constant level which is at or above the critical temperature of the dense phase gas. Alternatively, the pressure of the dense phase gas may be maintained at or near the critical pressure and the temperature may be varied by applying heat by means of a heating element, to produce a phase shift of the dense phase gas.

The values of operating temperature and pressure used in practicing the process of the present invention may be calculated as follows. First, the cohesive energy value of the material to be deposited is computed or a solubility value is obtained from published data. Next, based upon the critical temperature and pressure data of the selected dense phase gas or gas mixture, and using gas solvent equations, such as those of Giddings, Hildebrand, and others, a set of pressure/temperature values is computed. Then, a set of curves of solubility parameter versus temperature is generated for various pressures of the dense phase gas. From these curves, a phase shift temperature range at a chosen pressure can be determined which brackets the cohesive energies (or solubility parameters) of the material to be deposited. Due to the complexity of these calculations and analyses, they are best accomplished by means of a computer and associated software.

The substrate on which the desired material may be deposited in accordance with the present invention may comprise any material which is compatible with the desired material to be deposited and the chosen dense phase gas, as well as being capable of withstanding the elevated temperature and pressure conditions used in the present process. The substrate may have a simple or complex configuration and may include interstitial spaces which are difficult to coat by other known processes. Due to the excellent penetration properties of the dense phase gas used in the present process, this process is especially well-suited to provide coatings on structures having intricate geometries and tightly spaced or close tolerance interfaces. Suitable substrates for use in the present process include, for example, bearings, ceramic structures, rivets, polymeric materials, and metal castings. In addition, substrates formed of various types of materials may be coated in a single process in accordance with the present invention.

In accordance with an alternative embodiment of the present invention, the coating formed on the substrate may be subsequently treated to modify it. For example, a coating of a material which can be cured to a polymer by exposure to ultraviolet radiation may be formed on the substrate by the above-described process, and then the coating may be exposed to ultraviolet radiation to produce the cured polymer. The exposure to radiation is performed in the coating chamber after deposition and purging have been completed. As another example, a metal-containing material may be deposited on a substrate in accordance with the present process as previously described, and then the deposited material is treated with a reducing agent which converts the deposited material to a metallization layer. The reducing agent is injected into the coating chamber after deposition and purging have been completed. Similarly, a deposited material may be treated with an oxidizing agent to alter its composition.

In practicing the process of the present invention, the substrate is placed in a coating chamber which is formed of a material that is compatible with the dense phase gas and the chosen material to be deposited and which is capable of withstanding the elevated temperatures and pressures which may be required in order to maintain the dense phase gas at or near critical temperature and pressure conditions. A high pressure chamber formed of stainless steel is one such suitable coating chamber which is commerically available.

A flowchart showing the steps in an exemplary coating process of the present invention is shown in FIG. 1. The process is carried out in a coating chamber of the type described above. The substrate is placed in the coating chamber. As shown in FIG. 1, the coating chamber is initially purged with an inert gas or the gas or gas mixture to be used in the coating process. The temperature in the coating chamber is then adjusted to a temperature either below the critical temperature (subcritical) for the gas or gas mixture or above or equal to the critical temperature (supercritical) for the gas. The cleaning vessel is next pressurized to a pressure which is greater than or equal to the critical pressure (Pc) for the chosen gas or gas mixture. A mixture of the chosen dense phase gas and the material to be deposited is formed external to the coating chamber by passing the gas through a chamber containing the material to be deposited. To facilitate forming this mixture, liquid coating material may be atomized. The flow rate of the gas necessary to provide the desired concentration of the material to be deposited in the mixture is determined by calculation, using the previously discussed solubility properties. The mixture is then injected into the coating chamber where it is compressed. Optionally, the mixture may be compressed prior to being introduced into the coating chamber. Alternatively, but less desirably, a reservoir of the material to be deposited is placed in the coating chamber and the dense phase gas alone is injected into the chamber. Contact of the mixture of the dense phase gas and material to be deposited with the substrate is maintained for a predetermined period of time which is sufficient to assure that there is complete penetration of the mixture into or onto all the surfaces of the substrate. Because this mixture penetrates into the interstices of the substrate, the present process may also be regarded as an impregnation process. Next, the dense phase gas is phase shifted, as previously described herein, to cause the material to be deposited to precipitate out of solution in the dense phase gas and thus form the coating on the surfaces of the substrate. Control of temperature, pressure and gas flow rates is best accomplished under computer control using known methods. The substrate may be exposed to successive batches of the mixture of the material to be deposited and the dense phase gas, which is then phase shifted, in order to deposit the desired material to the required thickness. In accordance with an alternative embodiment of the present invention, the coating formed on the substrate may be treated further to alter the coating material as previously described. After the coating process has been completed, the coating chamber is purged with helium or nitrogen, for example. Then the chamber is depressurized and the coated substrate is removed from the chamber.

Figure 2:
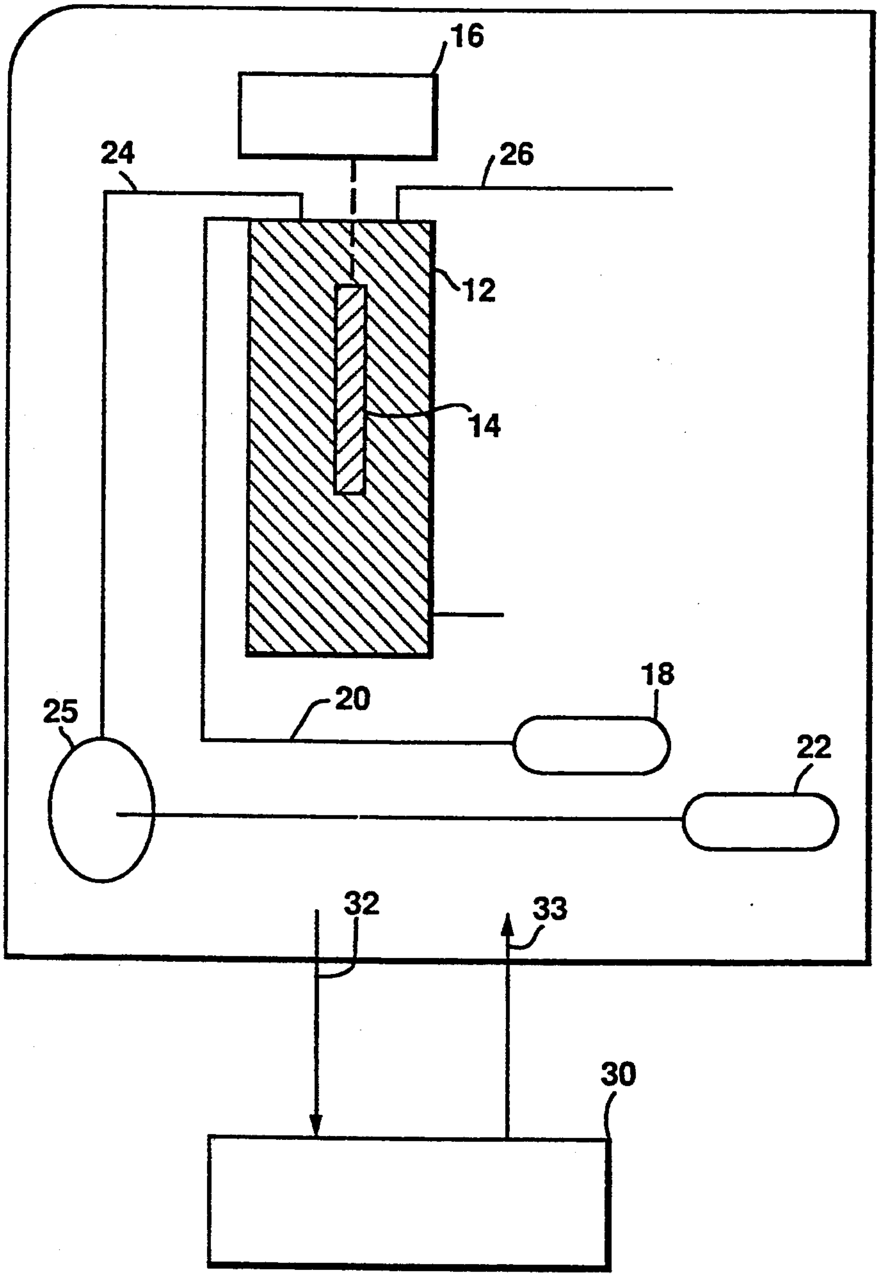
FIG. 2 is a diagram of an exemplary system for use in accordance with the present invention.

An exemplary system for carrying out the process of the present invention is shown diagrammatically in FIG. 2. The system includes a high pressure coating chamber or vessel 12. The substrate is placed in the chamber 12 on a loading rack (not shown) which may accommodate multiple substrates. The temperature within the chamber 12 is controlled by an internal heater assembly 14, which is powered by a power unit 16 that is used in combination with a cooling system (not shown) surrounding the coating chamber. Coolant is introduced from a coolant reservoir 18 through coolant line 20 into a coolant jacket or other suitable structure (not shown) surrounding the high pressure vessel 12. The mixture of the dense phase gas and material to be deposited from source 22 is injected into the chamber 12 through inlet line 24 by pump 25. Pump 25 is used to pressurize the contents of the chamber 12 to a pressure equal to or above the critical pressure for the particular dense phase gas being used. This critical pressure is generally between about 1000–10,000 pounds per square inch or 70–700 kilograms per square centimeter. The processing pressure is preferably between 1 and 272 atmospheres (15 and 400 pounds per square inch or 1.03 and 281.04 kilograms per square centimeter) above the critical pressure, depending on the phase shifting range required. The spent mixture, from which material has been deposited on the substrate, is removed from the chamber 12 through exhaust line 26. The dense phase gas thus removed may be recycled in the process.

The operation of the exemplary system shown schematically in FIG. 2 in most advantageously controlled by a computer 30 which uses menu-driven process development and control software. The analog input, such as temperature and pressure of the chamber 12, is received by the computer 30 as represented in FIG. 2 by arrow 32. The computer provides digital output, as represented by arrow 33 to control the various valves, internal heating and cooling systems in order to maintain the desired pressure and temperature within the chamber 12. The various programs for the computer will vary depending upon the chemical composition and geometric configuration of the particular substrate being cleaned, the material being deposited, the particular dense fluid gas or gas mixture being used, and the amount of time needed to produce the required thickness of the coating.

Prior to depositing the chosen material on the substrate in accordance with the present invention, it is advisable to precision clean the substrate to remove any possible contaminants which would degrade the quality of the coating. Known precision cleaning methods may be used. However, it is particularly advantageous to use the cleaning process using phase shifting of dense phase gases, as described in U.S. Pat. No. 5,013,366, assigned to the present assignee, the contents of which are hereby incorporated by reference. Alternatively, cleaning may be accomplished by the dense fluid photochemical process described in U.S. Pat. No. 5,068,040, assigned to the present assignee, the contents of which are hereby incorporated by reference. Since both of these cleaning processes use dense phase gases, the preliminary cleaning and subsequent coating process of the present invention may be performed in the same coating chamber.

The process of the present invention has many advantages. The use of a dense phase gas as a carrier solvent provides rapid penetration of the material to be deposited into all surfaces of the substrate. In addition, the amount of material to be deposited and the amount of the solvent can be controlled by adjusting the pressure, temperature and composition of the dense phase gas. Consequently, better control of deposition can be achieved and uniform layers can be deposited. The present process has the added advantages that non-toxic solvents are used and no toxic by-products are formed, thus avoiding any net negative impact on the environment.

The present process has a wide variety of applications. For example, a polymer material may be coated with a surfactant to provide a static-safe structure; or an elastomeric material may be impregnated with a compound which alters its physical properties, such as flex modulus, elasticity, hardness, color, or density. A metal layer may be formed on a substrate which has a complex or tightly-spaced configuration, or metal may be deposited on a support structure to form a catalyst. Structures may be prepared for non-destructive testing by being impregnated with a radioactive or dye penetrant material. Deodorized materials may be formed by impregnation with chlorophyll-derivative compounds, which may further be provided with an outer coating that provides a hermetic seal. Materials may be improved by impregnation with a preservative material, sealant, fire-retardant, or lubricant.

Having thus described exemplary embodiments of the present invention, it should be noted by those skilled in the art that the disclosures within are exemplary only and that various other alternatives, adaptations, and modifications may be made within the scope of the present invention. Accordingly, the present invention is not limited to the specific embodiments as illustrated herein, but is only limited by the following claims.

What is claimed is:

1. A method for forming a solid coating of a material on a substrate comprising the steps of:

(a) providing a mixture of said material in gas or liquid form and a dense phase gas, wherein said material is capable of being dissolved in said dense phase gas, said dense phase gas having a critical temperature and a critical pressure;

(b) placing said substrate in said chamber with said mixture at a temperature ranging from 25K below said critical temperature to 100K above said critical temperature and a pressure equal to or above the critical pressure of said dense phase gas whereby said material becomes dissolved in said dense phase gas to form a solution, and maintaining said contacting for a period of time which is sufficient to allow complete penetration of said solution into all surfaces of said substrate; and (d) shifting the phase of said dense phase gas from the supercritical state to the liquid state or from the liquid state to the supercritical state, whereby said material non-reactively precipitates out of said solution from said dense phase gas in said gas or liquid form and deposits in solid form on said substrate to form said coating on said substrate.

2. The method as set forth in claim 1 wherein said dense phase gas is shifted from the supercritical state to the liquid state.

3. The method as set forth in claim 2 wherein said shifting is provided by decreasing said temperature to a temperature below the critical temperature of said dense phase gas.

4. The method as set forth in claim 2 wherein said shifting is provided by decreasing said pressure to a pressure below said critical pressure of said dense phase gas.

5. The method as set forth in claim 1 wherein said dense phase gas is shifted from the liquid state to the supercritical state.

6. The method as set forth in claim 1 wherein said dense phase gas is selected from the group consisting of carbon dioxide, nitrous oxide, ammonia, helium, krypton, argon, methane, ethane, propane, butane, pentane, hexane, ethylene, propylene, tetrafluoromethane, chlorodifluoromethane, sulfur hexafluoride, perfluoropropane, and mixtures thereof.

7. The method as set forth in claim 1 wherein said coating is formed on the external surface of said substrate.

8. The method as set forth in claim 7 wherein said coating is exposed to ultraviolet radiation.

9. The method as set forth in claim 1 wherein said coating is formed on the interstitial surfaces of said substrate.

10. The method as set forth in claim 1 further comprising treating said coating to alter the properties thereof.

11. The method as set forth in claim 10 further comprising exposing said coating to a chosen reactant which reacts chemically with said coating to alter said coating.

* * * * *